United States Patent [19]
Whitfield

[11] Patent Number: 5,726,936
[45] Date of Patent: Mar. 10, 1998

[54] CONTROLLING CAPACITIVE LOAD

[75] Inventor: Colin Whitfield, Bristol, United Kingdom

[73] Assignee: SGS-Thomson Microelectronics Limited, Bristol, United Kingdom

[21] Appl. No.: 519,313

[22] Filed: Aug. 25, 1995

[30] Foreign Application Priority Data

Aug. 26, 1994 [GB] United Kingdom ............... 9417265.7

[51] Int. Cl.⁶ ........................................... G11C 7/00
[52] U.S. Cl. .................... 365/185.23; 365/185.24; 365/189.11
[58] Field of Search ............. 365/185.23, 185.24, 365/189.11, 195, 203

[56] References Cited

U.S. PATENT DOCUMENTS

| | | | |
|---|---|---|---|
| 4,996,571 | 2/1991 | Kume et al. | 357/23.5 |
| 5,095,461 | 3/1992 | Miyakawa et al. | 365/185 |
| 5,229,963 | 7/1993 | Ohtsuka et al. | 365/185.23 |
| 5,301,151 | 4/1994 | Wells et al. | 305/189.09 |
| 5,319,594 | 6/1994 | Uemura et al. | 365/185.23 |
| 5,396,463 | 3/1995 | Kim et al. | 365/189.11 |

FOREIGN PATENT DOCUMENTS 0 550 751   7/1993   European Pat. Off. ........ G11C 16/06

*Primary Examiner*—Son T. Dinh
*Attorney, Agent, or Firm*—David V. Carlson; Seed and Berry LLP

[57] ABSTRACT

A capacitive load such as the array ground line of a flash memory is initially pulled up towards a positive voltage via a first relatively weak current source, and subsequently a stronger source is switched to the load. To pull the load down, the pull up sources are turned off, and a relatively weak pull-down current source switched to the load. Subsequently a stronger pull-down source is switched to the load.

The arrangement may avoid high transient currents while ensuring adequate quiescent sourcing ability.

28 Claims, 9 Drawing Sheets

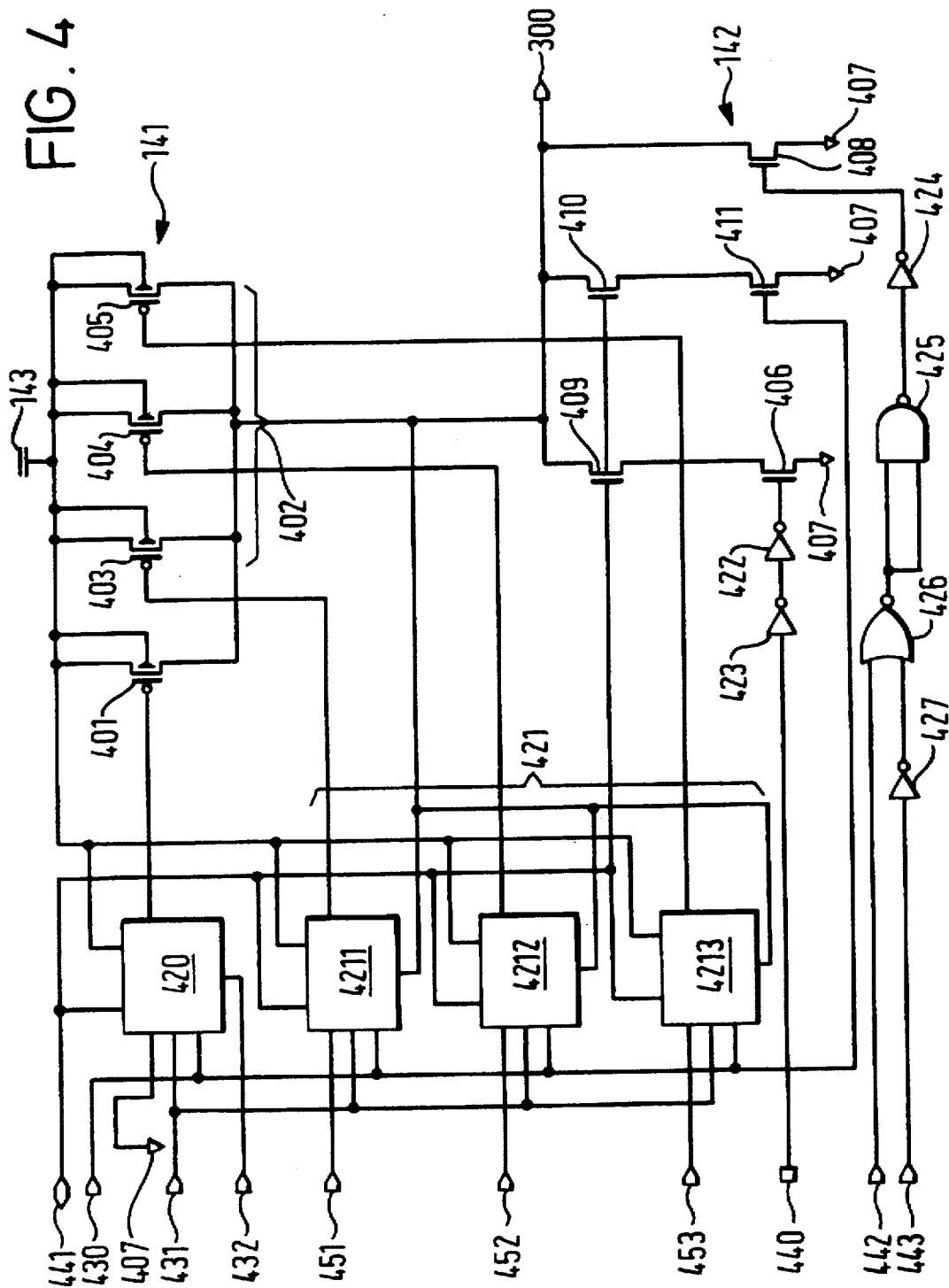

FIG. 12

|  | Selected Cell | | Unselected Cell Same Row | | | Unselected Cell Same Column | | |
|---|---|---|---|---|---|---|---|---|
|  | Drain Voltage | Gate Voltage | Source Voltage | Drain Voltage | Gate Voltage | Source Voltage | Drain Voltage | Gate Voltage | Source Voltage |
| PROGRAM | ~5V | $V_{PP}$ | $V_{GND}$ | $V_{GND}$ | $V_{PP}$ | $V_{GND}$ | ~5V | $V_{GND}$ | $V_{GND}$ |
| ERASE* | FLOATING | $V_{GND}$ | $V_{PP}$ | FLOATING | $V_{GND}$ | $V_{PP}$ | FLOATING | $V_{GND}$ | $V_{PP}$ |
| READ | PRECHARGED TO 1V BEFORE READING | ~5V | $V_{GND}$ | $V_{GND}$ | ~5V | $V_{GND}$ | PRECHARGED TO 1V | $V_{GND}$ | $V_{GND}$ |

* ALL CELLS SELECTED IN ERASE

CONTROLLING CAPACITIVE LOAD

TECHNICAL FIELD

The present invention relates to a method and apparatus for controlled pull-up and pull-down of a capacitive load, especially but not exclusively for the pull-up and pull-down of an array ground in a flash memory array. The invention may be applied to an EPROM or other memories particularly those using a floating gate transistor for each cell.

BACKGROUND OF THE INVENTION

A flash memory array 50, as shown in FIG. 11 and described later herein, typically comprises a plurality of single FET memory cells (FMoo-FMnm). Referring to FIG. 10, a selected one cell 2 is "programmed" by application of a programming potential Vpp to a control gate connected to a word line while a drain connected to a bit line 6 and a source connected to an array ground line 10 are supplied respectively with around 5 volts, and ground potentials. In the present context, "programming" means storage of charge on a floating gate of the cell, whereby the cell will assume a state referred to as logical "0". The contents of all cells in an array or group within the array may be erased simultaneously to achieve a state referred to as logical "1". This is done by applying an erase potential Vpp to the array ground of all cells while supplying respective erase potentials to the other terminals of all cells, for example allowing the drain terminals to float, and applying a ground potential to the control gate. Finally, the state of a cell may be read by applying reading potentials to the terminals of the cell and using a sense amplifier to determine whether the cell stores a logical '1' or logical '0'.

Examples of potentials which may be applied are shown in FIG. 12, and the operation of an exemplary cell is described later herein.

In flash memory arrays, the source electrodes of plural cells are connected in common. The common connection is herein referred to as the above-mentioned array ground 10. The control gates of cells are coupled to a respective one of plural row or word lines 8 and the drain electrodes to a respective one of plural column or bit lines 6. During operation the array ground is switched between ground potential, for programming, and a potential of approximately 12 volts for the erase operation. Since the array ground may have substantial capacitance, application of a low impedance source, or application of a low impedance sink, would result in a relatively high charge or discharge current flow leading to undesired effects in the circuit.

The array ground may be connected via a relatively large n-channel active device to ground potential for pulling the array ground down for reading or programming, and via a p-channel active device or a switched resistor to pull the array ground up to the erase potential, for erasing.

Such circuits must necessarily be a compromise. While the array ground is being respectively charged or discharged, the pull-up and pull-down devices are required to have enough impedance to avoid excessive current for the reasons described above. However, once the array ground has reached the steady state, the pull-up or pull-down device should have as low an impedance as possible to maintain the voltages needed for reading or programming purposes.

SUMMARY OF THE INVENTION

According to a first aspect of the present invention, there is provided a memory array having a plurality of charge storing transistors connected to a control line. The control line is also connected to a pull-up/pull-down voltage control circuit with a first and second pull-up circuit and a third and fourth pull-down circuit. Means are provided for changing the voltage level of the control line from a lower voltage level to an upper voltage level by disabling the third and fourth pull-down circuits, and after they are disabled, enabling the first pull-up circuit. The second pull-up circuit is inhibited until the control line reaches a desired voltage level after which the second pull-up circuit is enabled.

Means are also provided for changing the voltage level of the control line from an upper voltage level to a lower voltage level by disabling the first and second pull-up circuits, and after they are disabled, enabling the third pull-down circuit. The fourth pull-down circuit is inhibited until the control line reaches a desired voltage level after which the fourth pull-down circuit is enabled.

According to a second aspect of the present invention, there is provided a method of changing the voltage on a control line of a memory array having a plurality of charge-storing transistors connected to the control line from a lower voltage level to an upper voltage level comprising the steps of disconnecting a pull-down circuit from the control line, connecting the control line to an upper voltage level via a first pull-up circuit after the pull-down circuit is disconnected, delaying a period of time, and connecting the control line to the upper voltage level via a second pull-up circuit.

According to a third aspect of the present invention, there is provided a method of changing the voltage on a control line of a memory array having a plurality of charge-storing transistors connected to the control line from an upper voltage level to a lower voltage level comprising the steps of disconnecting a pull-up circuit from the control line, connecting the control line to a lower voltage via a third pull-down circuit after the pull-up circuit is disconnected, delaying a period of time, and connecting the control line to the upper voltage level via a fourth pull-down circuit.

According to a fourth aspect of the present invention, there is provided a memory array comprising a plurality of charge storing transistors, a control line connected to a plurality of the transistors to supply a common control voltage thereto, and a pull-up/pull-down voltage control circuit for changing the control voltage on the control line between an upper voltage level and a lower voltage level. The voltage control circuit has a first switch circuit to connect the control line to the upper voltage level and a second switch circuit to connect the control line to the lower voltage level. One of the switch circuits has a plurality of parallel switch devices together with a switch control to vary sequentially the impedance of the switch circuit during a switch operation to pull the control line to the voltage of the respective voltage level.

According to a fifth aspect of the present invention, there is provided a method of supplying voltage to a control line in a memory array having a plurality of charge storing transistors connected to the control line and supplied therefrom with a common control voltage. The method comprises the steps of connecting the control line to an upper voltage level via a first switch circuit, whereby the voltage on the control line is pulled up towards said upper voltage level, and connecting the control line to a lower voltage level via a second switch circuit, whereby the voltage on the control line is pulled down towards the lower voltage level wherein one of said connecting steps comprises controlling a plurality of parallel switch devices to vary sequentially the impedance of the respective switch circuit during a switch operation.

3

According to a sixth aspect of the present invention, there is provided a method of supplying voltage to a control line in a memory array having a plurality of charge storing transistors connected to the control line and supplied therefrom with a common control voltage. This method comprises the steps of connecting the control line to an upper voltage level via a first switch circuit, whereby the voltage on the control line is pulled up towards the upper voltage level; and connecting the control line to a lower voltage level via a second switch circuit, whereby the voltage on the control line is pulled down towards the lower voltage level wherein each of the connecting steps comprises controlling a plurality of parallel switch devices to vary sequentially the impedance of the respective switch circuit during a switch operation.

According to a seventh aspect of the present invention, there is provided a memory array having a plurality of cells connected to a control line and a circuit for controlled pull-up and controlled pull-down of the control line, comprising pull-up circuitry having first current supply circuitry for supplying a first pull-up current to the control line and second current supply circuitry for supplying a second pull-up current to the control line, pull-down circuitry having third current supply circuitry for supplying a third pull-down current to the control line, fourth current supply circuitry for supplying a fourth pull-down current to the control line and control circuitry for selecting between the first and second, and the third and fourth currents during a pull up/pull down operation to vary the impedance of the pull up/pull down current path.

According to a eighth aspect of the present invention, there is provided a threshold circuit having an input and an output which changes state when the input reaches a given threshold. The circuit comprises a supply node adapted to receive a first higher or a second lower voltage, a series connection of the channels of two threshold circuit FETs, the gates of which are coupled to the input, one end of the series connection being coupled to the supply node and the other to a reference node, and a node common to the threshold circuit FETs forming the output. The circuit further comprises a current path between the supply node and the output, the current path having a switching device enabled when the supply node receives the second voltage and a series threshold circuit FET whose gate is coupled to the input.

BRIEF DESCRIPTION OF THE DRAWINGS

The invention will now be described by way of example only, by reference to the accompanying drawings in which:

FIG. 4 shows a partial circuit diagram of a second embodiment of a pull-up and pull-down circuit in accordance with the present invention;

4

Figure 9:
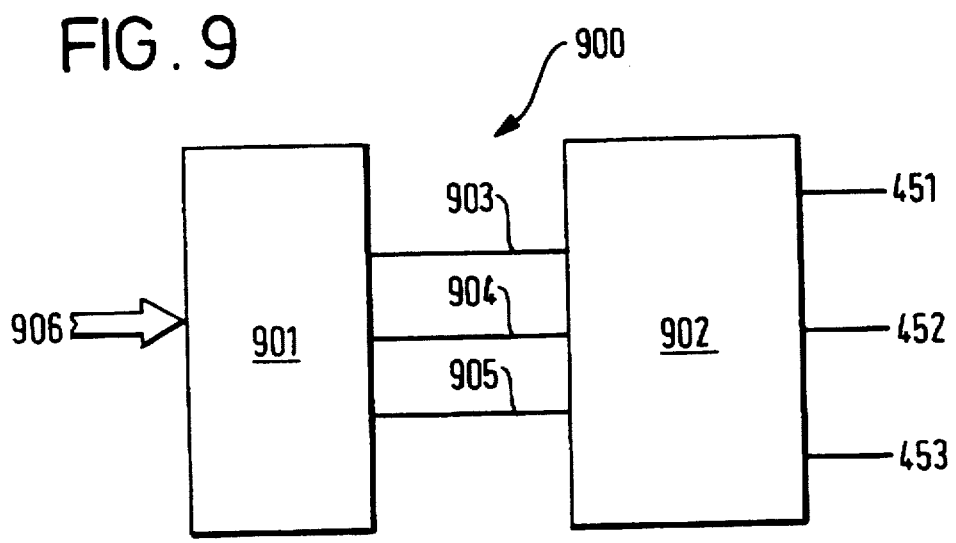
Figure 10:
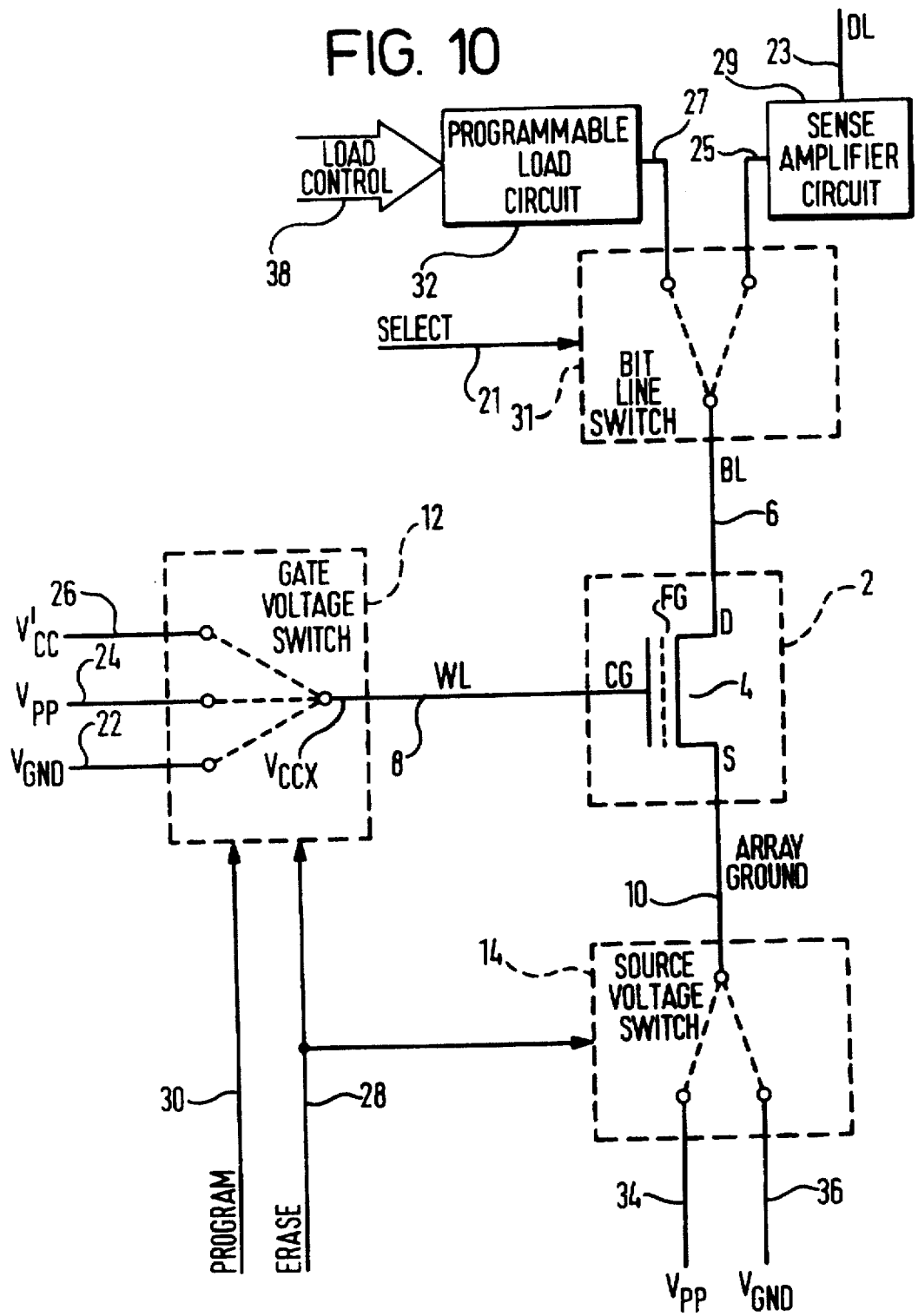
Figure 11:
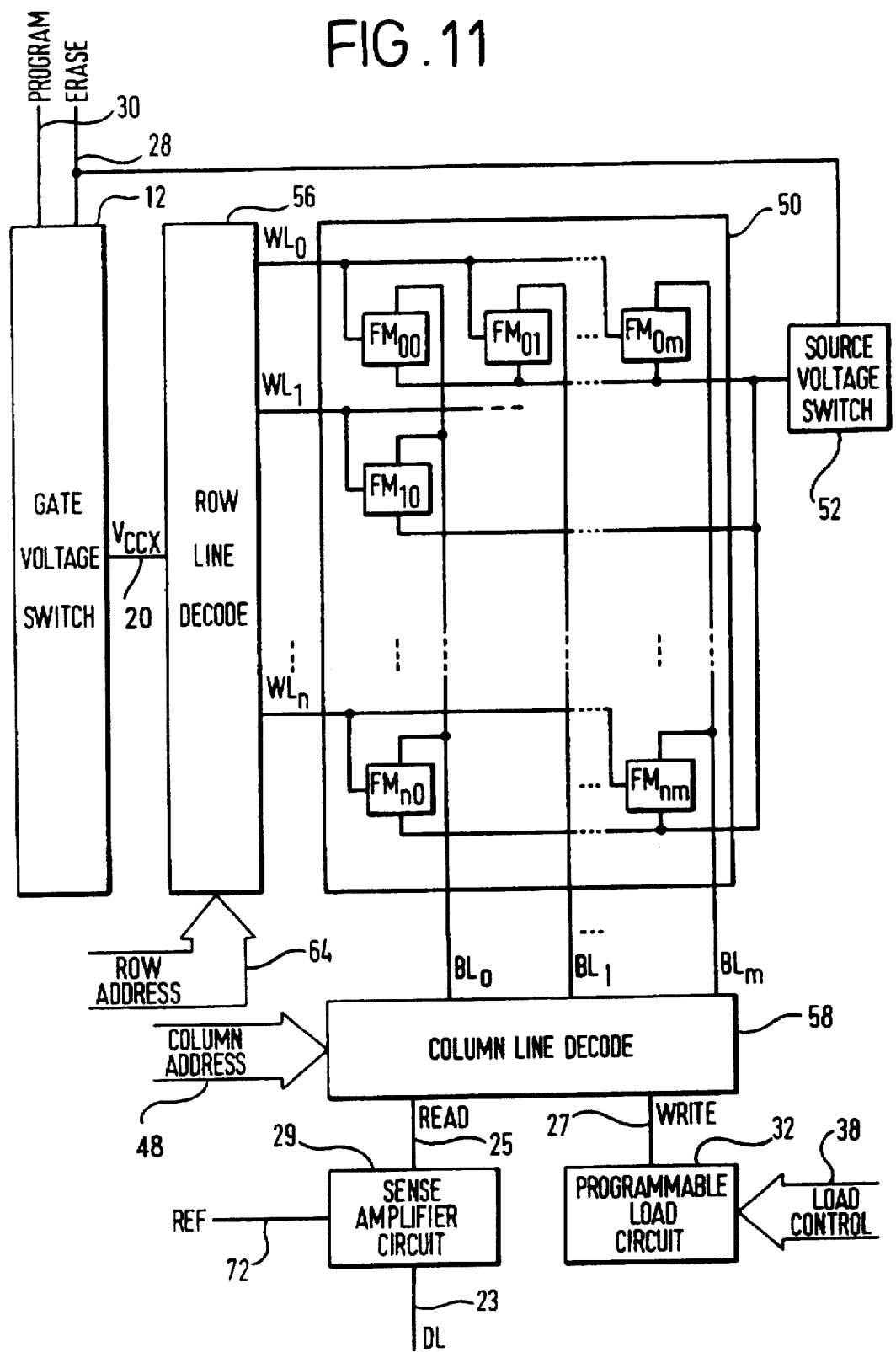

FIG. 9 is a block diagram of pull-up device selector circuitry for use with the circuit of FIG. 4;

FIG. 10 shows a circuit diagram of an exemplary memory cell of the type where a floating gate stores charge;

FIG. 11 shows an exemplary array of such transistors, embodied as a flash array; and FIG. 12 is a table of potentials of the flash memory array of FIG. 11.

In the figures, like reference numerals refer to like parts.

DETAILED DESCRIPTION OF THE INVENTION

Figure 1:
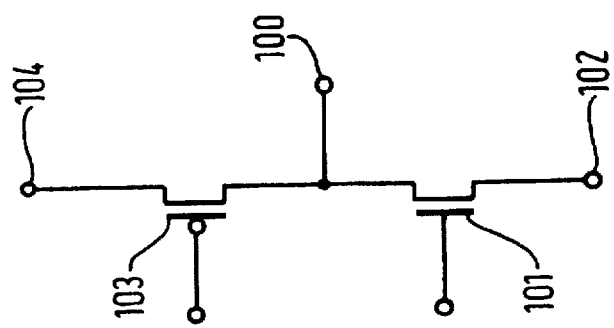
FIG. 1 shows a circuit diagram of a first pull-up and pull-down circuit.

Referring now to FIG. 1, a pull-up and pull-down circuit for an array ground 100 of a flash memory has a large n-channel FET device 101 connecting the array ground to ground potential line 102 and a p-channel FET device 103 connected between the array ground and a line 104 receiving a positive supply Vpp of around, for example, 12 volts.

During both a read operation and a program operation, the gate of FET 101 is held high by connection to a positive supply VCC of between about 3 and 5 volts. As a result, the pull-down FET 101 conducts and the array ground 100 is held at ground potential. During an erase operation, the gate of pull-down device FET 101 is connected to ground potential, thus cutting off the pull-down device, and the gate of the pull-up FET 103 receives a low potential, for example ground potential, so that the pull-up device strongly conducts. Hence, the array ground 100 is connected to the positive supply VPP at line 104 via the pull-up device 103.

This description has been simplified, since for example, the control voltages applied to the gates of the pull-up and pull-down FETs will be time-displaced to allow for the device which is conducting to become non-conducting before the other device is turned on.

Figure 2:
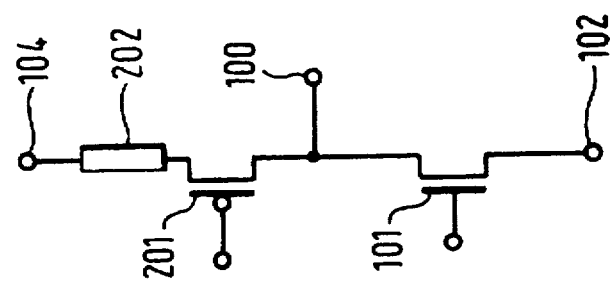
FIG. 2 shows a circuit diagram of a second pull-up and pull-down circuit.

Referring now to FIG. 2, array ground 100 is connected to a ground potential line 102 via an n-channel FET device 101 and to the positive supply line 104 via the series connection of a p-channel FET 201 and a resistor 202. In this alternative arrangement, the gate of the n-channel device 101 is connected to the ground potential VSS or to a positive supply VCC respectively to isolate array ground 100 from ground potential or to pull it down to ground. The gate of the p-channel device 201 is connected to ground for switching FET 201 on, thus pulling array ground 100 up to the positive potential on node 104, or is connected to the positive node 104 to switch FET 201 off.

As previously mentioned, the above described arrangements represent a compromise between the requirements to source (or sink) high currents in the quiescent condition and to provide low transient currents.

Figure 3:
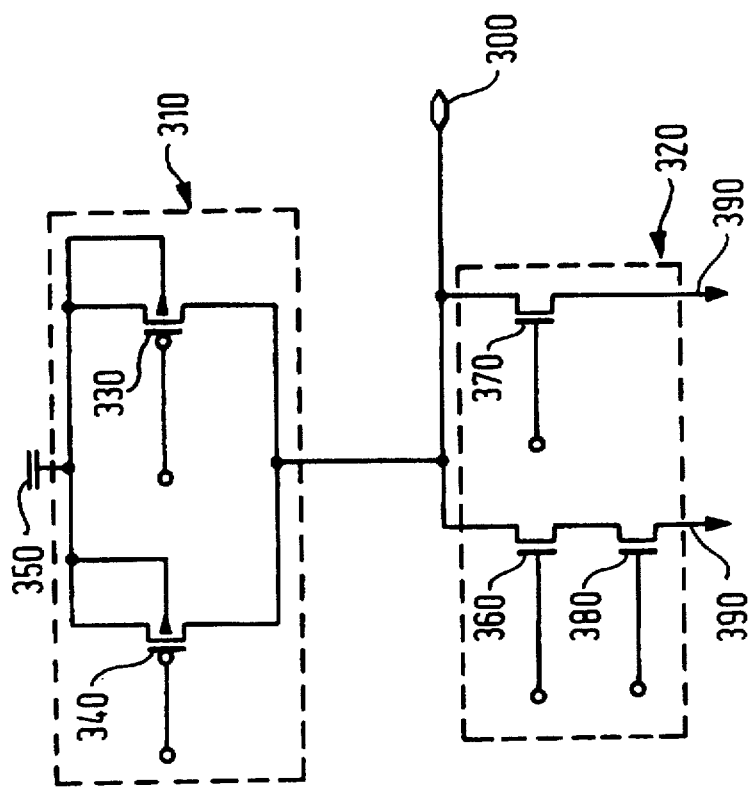
FIG. 3 shows a block diagram of a first embodiment of a pull-up and pull-down circuit in accordance with the present invention.

Referring now to FIG. 3, a capacitive line 300 such as the array ground of a flash memory is connected to pull-up circuitry 310 and pull-down circuitry 320. Control circuitry controls the pull-up and pull-down circuitry. The control circuitry may be load-voltage responsive circuitry or alternatively time responsive.

The pull-up circuitry has a first active device 330 which is a p-channel FET, and a second active device 340 which is also a p-channel FET. The two FETs 330 and 340 are connected with their drain-source paths in parallel, between the load 300 and a positive supply node 350.

The pull-down circuitry has a third active device 360 which is an n-channel FET, and a fourth active device 370 which is also an n-channel FET. The drain-source path of the third active device 360 is connected in series with the drain-source path of a fifth active device 380, also an n-channel FET. The series connection of the drain-source path of the third and fifth FETs 360 and 380 is connected between the load and a reference node 390, at ground potential. The drain-source path of the fourth FET 370 is also connected between the load and the reference node 390.

The width-length ratios of the FETs are as follows:

| | |
|---|---|
| 330 | 60/2 |
| 340 | 140/2 |
| 360 | 15/2 |
| 370 | 1154/1.6 |
| 380 | 15/2 |

In operation, the gate of the third FET 360 is normally biased high so that the third FET 360 represents a low resistance.

Assume that at a first instant the lead node 300 is connected to reference potential 390 via the series connection of third and fifth FETs 360, 380 which provide a first relatively high impedance path and via the much larger fourth FET 370 which provides a second relatively lower impedance path. At a time after this first instant, the fourth and fifth FETs are turned off, by drawing their gate potentials to ground. This terminates the application of pull-down current to the lead 300.

After a suitable time to allow the third and fourth FETs to become fully non-conducting, a pulse is applied to the gate of the first FET 330, which initiates conduction of that device by providing a relatively high impedance path. Accordingly, current flows from the supply node 350 through the first FET 330 to the load. The load voltage begins to rise as the capacitance of the load is charged.

The control circuitry maintains the gate of the second FET 340 at a high voltage, whereby the second FET remains non conductive.

Where the control circuitry is load-voltage responsive, and when the voltage on the load rises to a predetermined level, for example approximately 4 volts, the load-voltage responsive circuitry turns on the second FET 340. Alternatively the control circuitry may be time responsive, whereby the second FET 340 is turned on after a predetermined duration. Because the second FET 340 has more than twice the area of the first FET 330, the impedance presented to the load from the supply node 350 drops substantially, both FETs now conducting. Ultimately, the capacitive load 300 will reach substantially the supply potential of around 12 volts, with a sourcing capability determined by the parallel current-carrying capacity of the first and second FETs 330 and 340.

At a later time, where it is desired to return the load node 300 to ground potential, the first and second FETs 330 and 340 are turned off by the application of high voltages to their respective gates. Once the supply of pull-up current has been terminated, in other words when both first and second FETs 330 and 340 are fully non-conductive, the gate of the fifth FET 380 is supplied with an "on" potential, so that the load node discharges through the series connection of the drain-source paths of the third and fifth FETs 360 and 380. Load-voltage responsive control circuitry would monitor the voltage on the load node 300 and maintain the fourth FET 370 in the off condition until the load node voltage drops to a predetermined level, for example one volt. Alternatively, the control circuitry may be time responsive, and in that event would maintain the fourth FET 370 off until a predetermined time has elapsed. In either case the control circuitry switches the transistors sequentially to ultimately apply an "on" potential to the gate of the fourth FET 370. The fourth FET has a substantially higher area than that of the path of the series connection of third and fifth FETs 360 and 380, and thus once the fourth FET is on, the load node 300 is brought to, and then maintained at, ground potential through a low impedance.

Referring now to FIGS. 4-8, a second embodiment of the invention will be described.

FIG. 4 shows part of a flash memory having an array ground 300 connected to pull-up circuitry 141 and pull-down circuitry 142. The pull-up circuitry 141 has first current supply circuitry 401 being a p-channel FET connected between a positive supply node 143, in operation receiving a first supply voltage Vpp, and the array ground 300, and second current supply circuitry 402, which consists of three parallel FETs 403, 404, 405. The second current supply circuitry is also connected between the supply node 143 and the array ground 300.

The pull-down circuitry 142 has third current supply circuitry consisting of a series circuit of two n-channel FETs 406, 409 connected between the array ground 300 and a ground potential node 407. Fourth current supply circuitry is an n-channel FET 408 connecting the array ground 300 to the ground potential node 407.

Also connected between the array ground 300 and the ground potential node 407 is an arrangement consisting of two n-channel FETS 410, 411 having their drain-source paths connected in series. The gate of FET 411 is coupled to an inhibit input terminal 430. The gates of FETs 410 and 409 are connected to a bias terminal 441 which in operation receives a dc voltage sufficient to render them conductive. FETs 409 and 410 act as voltage dropper devices so that the voltage present on the array ground 300 does not appear across the channel of a single device. The series arrangements of FETs 406 and 409, and of FETs 410 and 411 results in effective sharing of voltage between the transistors. Without such sharing, destruction of a single device might occur.

The gate of the first FET 401 is connected to first trigger circuitry 420. The first trigger circuitry, which will be described more fully with reference to FIG. 5, receives inputs from the inhibit input terminal 430, from a trigger input terminal 431, from the bias terminal 441, and from a supply level logic terminal 432. The gates of the FETs 403, 404, 405 are connected to and controlled by second trigger circuitry 421, being three similar driver devices 4211, 4212, 4212 each connected to a respective FET 403, 404, 405. The driver devices of the second trigger circuitry, which will be more fully described with reference to FIG. 6, receive inputs from the trigger input terminal 431, from the bias terminal 441, and from respective pull-up enable inputs 451, 452, 453, from a pull-up device selector circuit, described later herein and shown in FIG. 9.

The n-channel FET 406 is connected to a control terminal 440 via series-connected inverters 422 and 423 which form the third trigger circuitry. To the first input terminal 440 is applied a second delayed erase pulse (E) derived from an erase switch clock control circuit, which will be more fully described later herein with respect to FIG. 7. The bias terminal 441 is also connected to the first and second trigger circuitry 420 and 421. The gate of FET 408 of the fourth current supply circuitry is connected to third and fourth control terminals 442 and 443 via a logic arrangement which forms the fourth trigger circuitry. The logic arrangement consists of an inverter 424 connected to the gate of transistor 408, the input of the inverter being connected to the output of a first NAND gate 425 whose two inputs are commonly connected to the output of a first NOR gate 426. One input to the first NOR gate 426 is connected to the third control terminal 442 and the other input to the first NOR gate 426 is connected to the fourth control terminal 443 via a further inverter 427.

Figure 8:
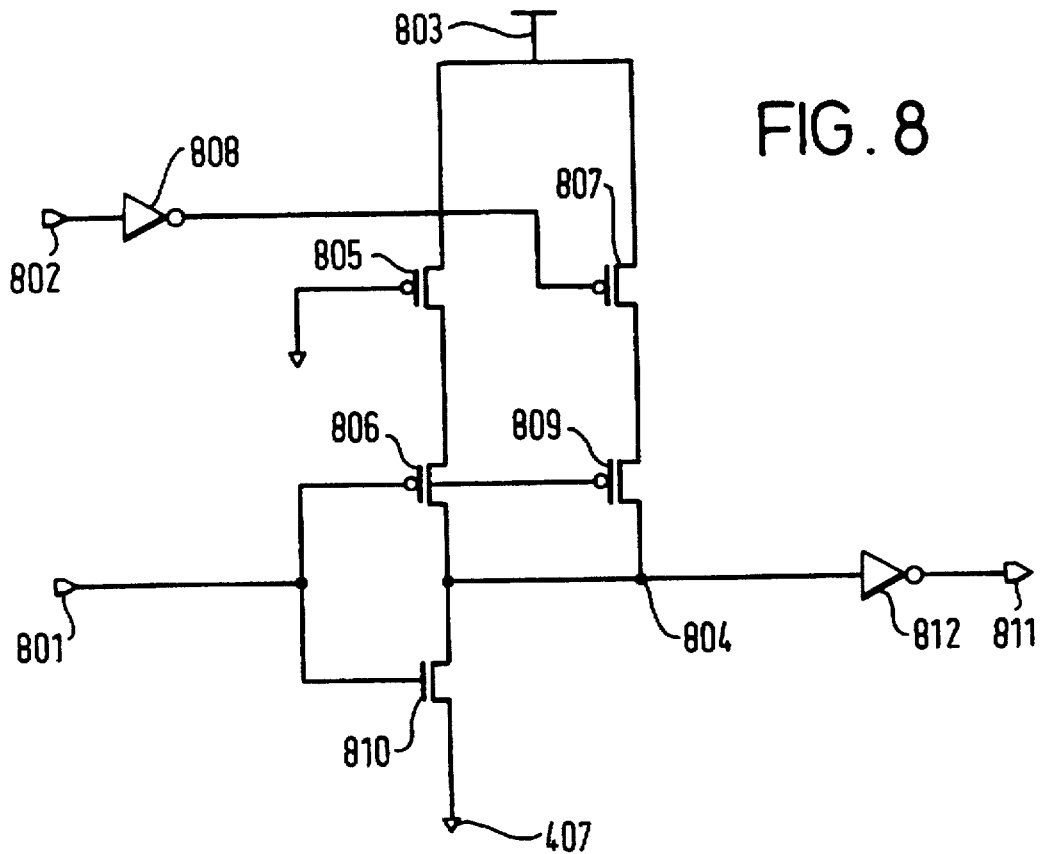
FIG. 8 shows a circuit diagram of a threshold circuit for use in the circuit of FIG. 4.

To the fourth control terminal 443 is fed an undelayed erase pulse (-ERASE) 427, and to the third is fed the output of an array ground feedback control circuit which will be more fully described herein with respect to FIG. 8 and also referred to herein as a threshold circuit.

Part of the flash memory, e.g., the feedback control circuit described with respect to FIG. 8, and other elements not specifically described herein receive a second positive supply voltage VCC which may be either at nominal 5 volts or at nominal 3 volts, or under certain conditions may be effectively absent. When the second positive supply voltage VCC is at the lower voltage, a supply level logic signal of 'high' level is applied to the supply level logic terminal 432. When the supply is absent, an inhibit signal of 'high' level is applied to the inhibit input terminal 430.

Figure 5:
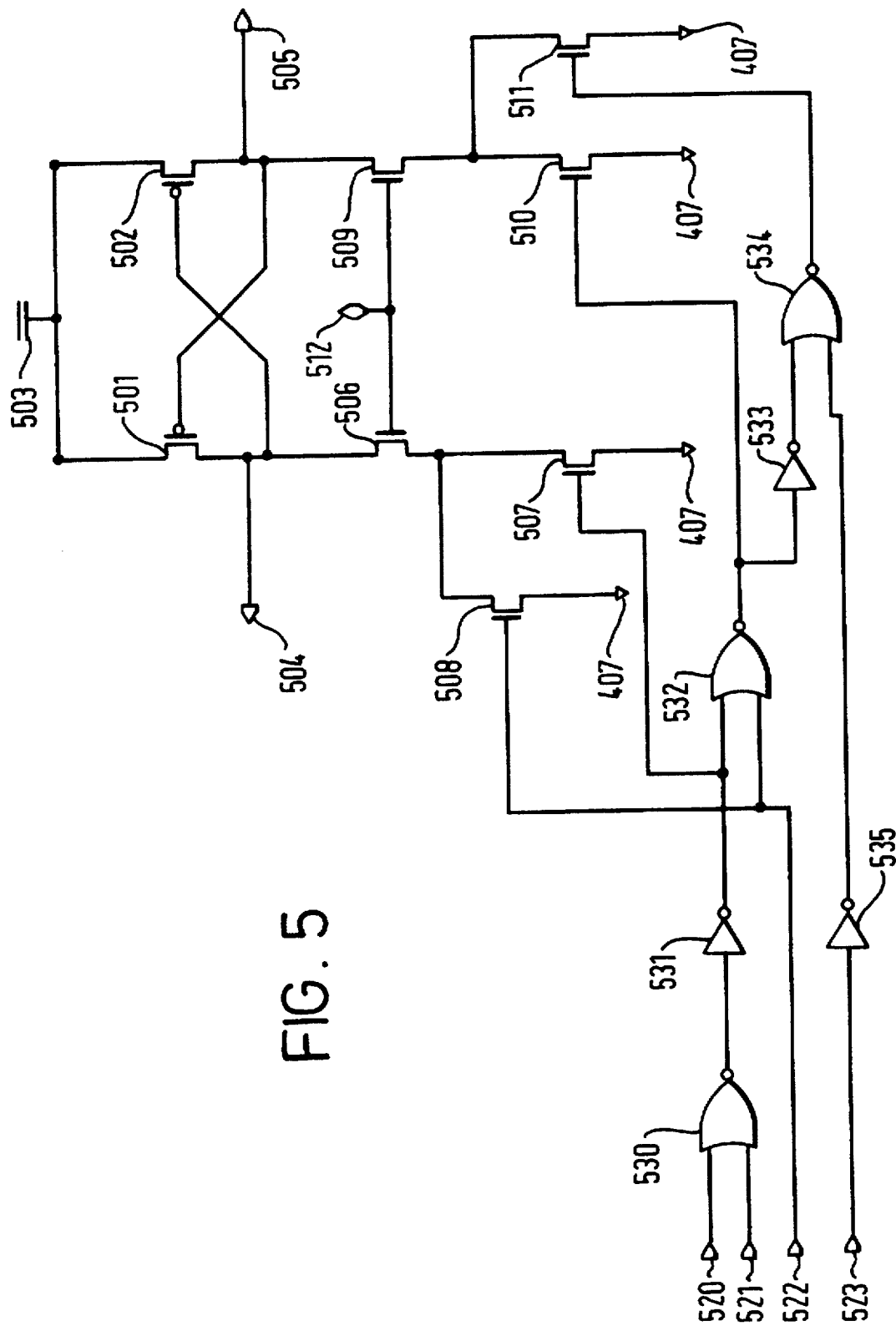
FIG. 5 shows a circuit diagram of first trigger circuitry for use in the circuit of FIG. 4.

Referring now to FIG. 5, the first trigger circuitry 420 consists of a cross-coupled pair of p-channel FETs 501 and 502 having channels connected between a positive supply node 503 and first and second output nodes 504 and 505. The second output node, in operation, supplies the gate of FET 401 of the first pull-up circuitry. In series with the channel of the first FET 501 lies the series connection of a third n-channel FET 506 and a fourth n-channel FET 507. A node common to transistors 506 and 507 is connected to ground node 407 via a fifth FET 508, and the other end of the channel of fourth FET 507 is also connected to ground potential node 407. The second output node 505 is connected to ground potential node 407 via the series connection of a sixth n-channel FET 509 and a seventh n-channel FET 510. A node common to the sixth and seventh FETs is connected to ground via an eighth n-channel FET 511. The gates of the fourth and sixth FETs 506 and 509 are commoned together and connected to a bias input 512.

The first trigger circuitry 420, also referred to as an erase initialising high voltage switch, further has second and third control inputs 520 and 521, a fourth input 522 for the above-mentioned inhibit signal and a fifth input 523 for the above-mentioned supply level logic signal.

The second and third control inputs 520 and 521 form the two inputs to a NOR gate 530, whose output is inverted by first inverter 531. The output of first inverter 531 forms a signal which is applied to the gate of the fourth FET 507, and is also fed to a second NOR gate 532. A second input of the NOR gate 532 is derived from the fourth input 522, which input also provides the control for the gate of the fifth FET 508. The output of NOR gate 532 forms the input signal for the gate of the seventh FET 510 and further is fed via a second inverter 533 to one input of a third NOR gate 534 whose output provides the control signal for the eighth FET 511. A second input of the third NOR gate 534 is derived from the fifth input 523 via a third inverter 535. The NOR gates 530, 532 and 534, and the inverters 531, 533 and 535 in common with the logic gates and inverters elsewhere in the circuitry described herein, are supplied from the previously-mentioned positive supply VCC, which in use may be at 3 volts nominal or 5 volts nominal. It will be understood by one skilled in the art that the output response of the logic circuitry will be different when supplied with 3 volts than when supplied with 5 volts. Specifically, in the circuitry described here with respect to FIG. 5, the output range of NOR gate 532 will be between about 3 volts and about 0 volts for a 3 volt supply, and between about 5 volts and about 0 volts for a 5 volt supply.

In operation, the bias input which is connected to the bias terminal 441 of FIG. 4 receives a voltage sufficient to bias the fourth and sixth FETs 506, 509 to be on. The third control input 521 is connected to ground and the first control input 520 is connected to the trigger input terminal 431 of FIG. 4 to receive a first delayed erase pulse (-E). The flash memory, a part of which is described herein, receives two positive supplies. As previously discussed, the inhibit signal applied to the fourth input is high when a supply VCC is effectively absent. The level logic signal applied to the fifth input is high where the memory is operated at VCC nominally 3 volts.

The above-described logic arrangement provides the following control conditions for the relevant transistors.

The fourth transistor 507 will be on when the first delayed erase pulse (-E) is high.

The fifth transistor 508 will be on when the inhibit signal is high, i.e., VCC is absent.

The seventh transistor 510 will be on only when both the first delayed erase pulse (-E) and inhibit are low, i.e., VCC is not absent.

The eighth transistor 511 will be turned on only when the supply level logic signal is high and both the first delayed erase pulse and the inhibit are low, ie, when VCC is low, VCC is not detected as absent, and the first delayed erase pulse is present.

The cross-coupled first and second transistors 501 and 502 form a bistable arrangement in cooperation with the dual gate arrangement formed by third and sixth transistors 506 and 509. The bistable arrangement operates as follows.

With bias applied to input 512, the third and sixth FETs 506 and 509 are turned on. The positive supply voltage is applied to the bistable-connected first and second FETs 501 and 502 and, when one of the FETs 507, 508, 510 or 511 conducts, either first FET 501 or second FET 502 will conduct. For example, when a high first delayed erase pulse is applied to the third control terminal 521 as mentioned above, the fourth transistor 507 will be turned on. Hence, the voltage at first output node 504 will be pulled down by the series connected "on" FETs 506 and 507. Since the output node 504 is connected to the gate of the second FET 502, the second FET 502 is turned on which causes the second output node 505 to rise in potential to substantially the positive supply node potential at node 503. The rise of second output node 505 turns off the FET 401 of the first current supply circuitry. The second output node 505 is connected to the gate of the first FET 501 and as a result the first FET 501 will turn off. The bistable is thus set with second output 505 high and first output 504 low.

When a low first delayed erase pulse (-E) and a low inhibit signal are applied, transistor 510 turns on, pulling node 505 down and enabling the first current supply circuitry.

As noted above, when the VCC supply is at the higher 5 volts nominal level, the output of NOR gate 532 will be at about 5 volts in the logical high state. This turns the seventh transistor 510 on relatively hard, so that the maximum current passed by the transistors is relatively high. However, when the VCC supply is at the lower 3 volts nominal level, the output of the NOR gate 532 will be only at about 3 volts in the logical low state. This voltage applied to the gate of the seventh transistor 510 will only turn the transistor on relatively weakly, so the maximum current passed by the transistor is relatively low. Moreover, the transition between the logical low and the logical high states will vary according to the supply voltage, so that a threshold of, for example, 1.5 volts will be read more quickly with a high supply voltage, assuming the same rate of change of input.

The eighth transistor 511 is enabled only when the VCC level is low so as to provide additional current sinking ability from the second transistor 502 and the gate of the first transistor 501 under the 3 volt condition. This eighth transistor 511 is dimensioned so that under 3 volt supply conditions the overall delay between application of the delayed erase pulse (-E) to first control input 520 and the appearance at node 505 of the current supply enabling transistor, is the same as provided by the seventh transistor 510 under 5 volt conditions. Thus the eighth transistor 511 together with the associated logic circuitry 534, 535 constitutes compensation circuitry for equalising the behaviour of the first trigger circuitry in the two VCC modes.

Figure 6:
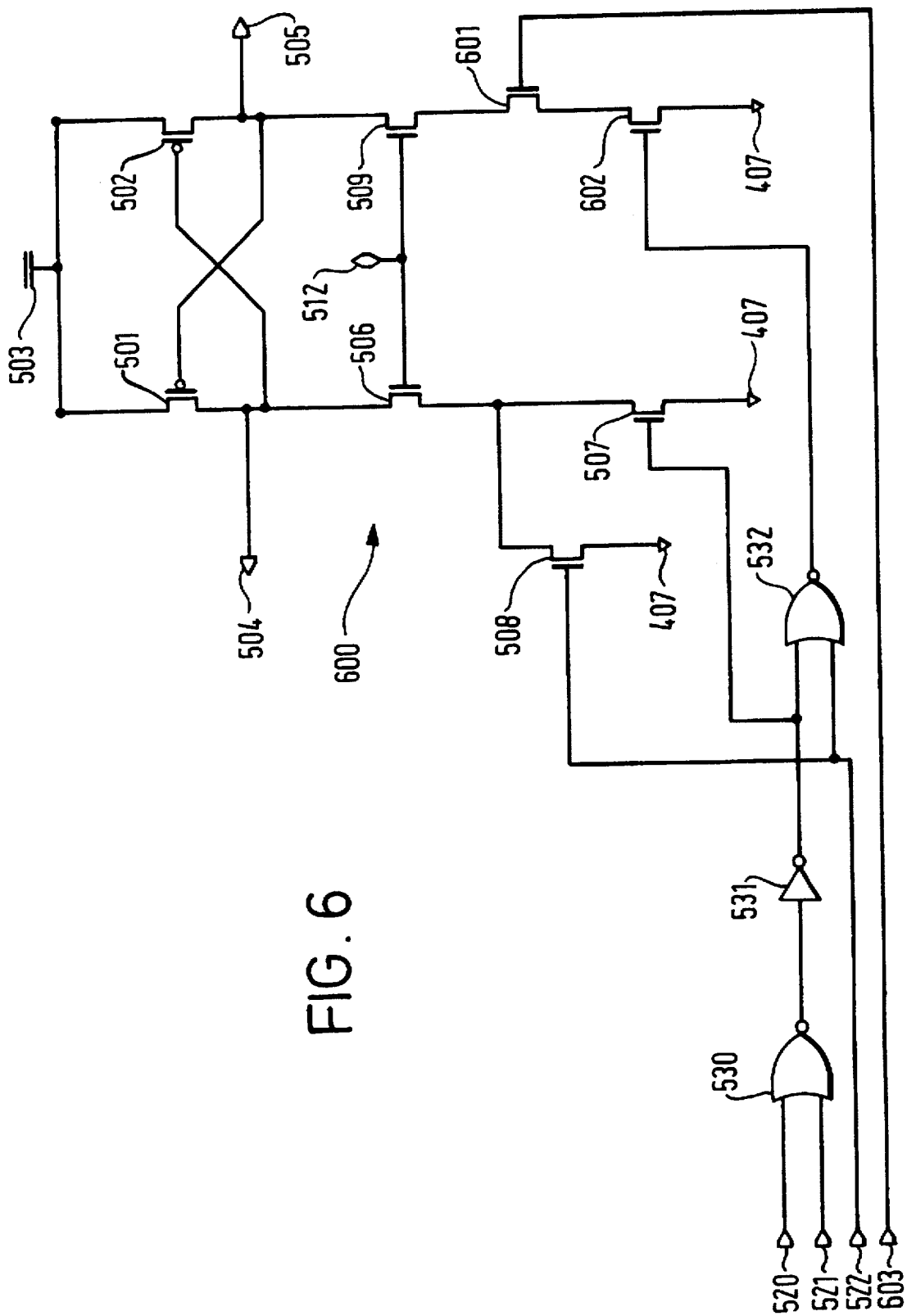
FIG. 6 shows a circuit diagram of second trigger circuitry for use in the circuit of FIG. 4.

A driver device of the second trigger circuitry will now be described with reference to FIG. 6.

The driver device 600 is somewhat similar to the first trigger circuitry which has previously been described, and has first and second cross-coupled bistable FETs 501 and 502 each connected to a respective one of third and sixth FETs 506 and 509. The common gates of the third and sixth FETs 506, 509 are coupled to a bias input 512.

The other end of the channel of the third FET 506 is coupled to ground potential via a current path having parallel fourth and fifth FETs 507 and 508, which are controlled by a similar combination of a first NOR gate 530 and a first inverter 531.

The other end of the channel of the sixth FET 509, instead of being connected via a parallel combination of FETs to the ground potential node 407, is connected to ground potential node 407 via the series connection of a seventh FET 601 and an eighth FET 602. The gate of the eighth FET 602 is connected to a second NOR gate 532 as has been described with reference to FIG. 5. The gate of the sixth FET 601 is however connected to an input terminal 603 which receives the potential applied to the array ground node 30.

In operation, the second control input terminal 520, as described with reference to FIG. 5, is connected to the delayed erase pulse (-E) but, the third control input terminal 521, rather than being connected to ground instead receives a control voltage from a respective pull-up enable input 451, 452, 453 (FIG. 4). The control voltage selects or deselects a driver device and hence a particular pull-up transistor 403, 404, 405. However, in the embodiment described, the particular driver devices and pull-up transistors which are operative may be chosen during an initial test, and not changed thereafter.

The output of first NOR gate 530 will be low when either or both the delayed erase pulse (-E) and the control pulse applied to the third input 521 are high. Thus, after inversion by the inverter 531, the fourth FET 507 will be turned on when either one or both inputs applied at second and third control input terminals 520 and 521 are high.

The fifth FET 508 is, as has been described with reference to FIG. 5, connected to the fourth input terminal 522, which receives the previously discussed inhibit signal; hence, fifth FET 508 will be off when the inhibit signal is at low, i.e. when the supply voltage VCC is not absent.

Turning to the second branch or current path of the driver circuit of the second trigger circuitry, namely that consisting of second, sixth and eight FETs 502, 509, 602, seventh FET 601 will be turned on when the array ground potential applied to fifth input terminal 603 is greater than a predetermined level, for example around 4 volts. The serial eighth FET 602 will be turned on only when the inhibit signal is low and simultaneously both the pull-up enable input applied to the third input terminal 521 and the delayed erase pulse (-E) applied to second input terminal 520 are low. For the output 505 to be low (output 505 needs to go low to turn on an associated pull-up transistor 403, 404, 405) the pull-up enable 521 and delayed erase inputs 520 must be low, the array ground potential must be above the above predetermined level 603 and the inhibit signal 522 be low.

The erase switch clock control circuit will now be described with reference to FIG. 7.

The array switch clock control circuit consists of two generally parallel cross-coupled paths. The first path has a first NAND gate 701 having a first input connected to a circuit input 702, and a second input which will be described later. The output of the first NAND gate 701 is connected to a series connected chain of seven inverter circuits 703–709. The second path has a eighth inverter 710 receiving the input from the circuit input 702 and having an output connected to one input of a second NAND gate 711. The second input of the NAND gate 711 will be described later. The output of the second NAND gate 711 is connected to a series chain of six inverters 712–717.

In the first path, a node common to fourth and fifth inverters 706 and 707 is cross connected to the second input of the second NAND gate 711. In the second path the node common to the inverters 715 and 716 is cross-connected to the second input of the first NAND gate 701. Delayed output signals are derived from the outputs of inverters 709 and 717, at respective terminals 718 and 719.

The operation of the erase switch clock control circuit will now be described.

Assume that the input terminal 702 is at low. Then the first input of first NAND gate 701 will also be at low and the first input of the second NAND gate 711 will be high, owing to eighth inverter 710. The output of the first NAND gate 701 is high, since it can be low only if both gate inputs are at high, and as previously mentioned the first input is low. The output of inverter 703 will be low, that of inverter 704 high, that of inverter 705 low, that of inverter 706 high. This last-mentioned high is cross-connected to the second input of second NAND gate 711, which accordingly has an output at low potential. The output of inverter 712 will thus be high, that of inverter 713 low, that of inverter 714 high and that of inverter 715 low. The last-mentioned low potential is applied to the second input of the first NAND gate 701. By the same analysis, the output of the first chain at terminal 718 will be low, and the output of the second chain at terminal 719 will likewise be low.

For the other steady-state condition, i.e., the input at terminal 702 is high, the opposite conditions to those described above will pertain. In other words, the outputs will both be high. However, in the transient state, when the input changes from low to high, and assuming that all inverters induce the same signal delay, the output of second NAND gate 711 will change state to high after a delay of one period and the change will reach the output of inverter 715 after a further four periods. After two further periods the output of gate 717 will change state. However in the first path the output of first NAND gate 701 will not change state until the output of inverter 715 has changed state, i.e., after five periods. The output of 709 will change state seven further periods later. Hence, the result of the circuit is to respond to an input erase pulse at terminal 702 to provide a first delayed erase pulse (-E) at terminal 719 which changes state from low to high a defined period before the corresponding change of state of the second delayed erase pulse (E) at terminal 718, and which changes state from high to low a defined period after the corresponding transition of the second delayed erase pulse (E).

The array ground feedback control circuit or threshold circuit will now be described with reference to FIG. 8.

The array feedback control circuit has a first input terminal 801 which is connected, in operation, to the array ground node 300. The circuit has a second input 802 receiving the previously discussed supply level logic signal. The circuit generally consists of two parallel branches, each branch having the series connection of two p-channel FETs connected between a supply node 803 and an intermediate node 804. The first branch has a first FET 805 having a gate connected to ground potential and a second serial FET 806 whose gate is connected to the first input terminal 801. The second branch has a third FET 807 whose gate is connected to the second input terminal 802 via a first inverter 808. The second branch also has a fourth FET 809 whose gate is connected to the first input terminal 801. One end of the channels of the first and third FETs is connected to the supply node 803 and the remote ends of the channels of FETs 806 and 809 are connected to the intermediate node 804. The intermediate node is connected to ground potential via a fifth FET 810 which is fin n-channel device having a gate connected to the first input terminal 801. The intermediate node 804 is connected to an output terminal 811 through a second inverter 812.

In operation, the second and fifth FETs 806, 810 and the fourth and fifth FETs 809, 810 form respective inverters so that the logical state of the intermediate node 804 is opposite to that of the first input terminal 801 in the steady state. Accordingly, in the steady state the output terminal 811 follows the state of the input terminal 801. However the inverter arrangement has a threshhold of around one volt whereby the output 811 changes state when the array ground node 300, applied to input 801, is at around one volt.

As previously mentioned, the flash memory array is capable of operating with a second positive supply voltage VCC applied to supply node 803 of three or five volts. The supply level logic signal applied to second terminal 802 is high when the memory is being operated at VCC of nominally three volts. In this situation, as noted above, the third FET 807 conducts thereby ensuring a sufficient flow of current to adequately charge the intermediate node 804. The two paths—i.e., a first path having the above-mentioned first branch alone, together with the fifth FET 810, and a second path having the above-mentioned first and second branches together, and the fifth FET 810—allow a constant switching threshold to be maintained even though the voltage at the supply node switches between two values of supply.

Referring now to FIG. 9, a pull-up device selector circuit will now be described.

The selector circuit 900 consists of memory circuitry 901 and decoder circuitry 902. The memory circuitry 901 consists of three so-called "UPROM" cells, each of which is a latch of two floating gate transistor cells cross-coupled together. The output of each UPROM cell is a logical one or logical zero depending on which of the two floating gate cells is programmed, the default output being logical zero. The outputs of the memory circuitry are provided on three lines 903, 904 and 905 and these lines form the inputs to the decoder circuitry 902. The decoder circuitry 902 has output lines 451, 452 and 453 which provide inputs to the driver circuitry 4211, 4212 and 4213 of FIG. 4. The memory circuitry 901 also receives programming inputs 906 which are operated during an initial test and set up of the memory array to select which one, or which combination of the pull-up transistors 403, 404 and 405 are to be activated. In the present embodiment, the selection of pull-up transistors is performed only once for the life of the device. The decoder circuitry 902 consists of a logic circuit which, in response to the default inputs all being at logical zero, provides an output enabling a desired, non-zero number of pull-up transistors 403, 404, and 405. In the present described embodiment, the width to length ratios of the transistors 403, 404, 405 are all different, and differ from the width to length ratio of transistor 401. For example, the width/length ratios of transistors 401, 403, 404 and 405 may be respectively 60/2, 20/2, 40/2, and 80/2. By enabling different combinations of transistors 401, 403, 404 and 405 the voltage on the array ground line 300 during the erase operation may be controlled. This array ground voltage is believed to have an effect on the life time of an associated flash memory. The design of the decoder circuitry 902 will depend upon the values of length to width of the various pull-up transistors 401–405 and will depend upon the desired relationship between the inputs 903–905 and the outputs 451–453.

Referring now again to FIG. 4, the operation of the source switch circuit will now be described.

Assume that the array ground node 300 is at substantially ground potential, in the steady state being pulled down by the fourth current supply circuitry FET 408. The fourth FET is a large area device capable of sinking large currents. When it is desired to erase the contents of memory cells associated with the array ground 300, an erase line applied to input terminal 702 of the array switch clock control circuit described herein with reference to FIG. 7, and connected to the fourth input terminal 443 of the source switch presently being described changes state from high to low level. Accordingly, the output of inverter 427 becomes high which, by the logic circuit, causes the output of invertor 424 to discharge the gate of the fourth FET 408, whereby the FET begins to turn off.

Figure 7:
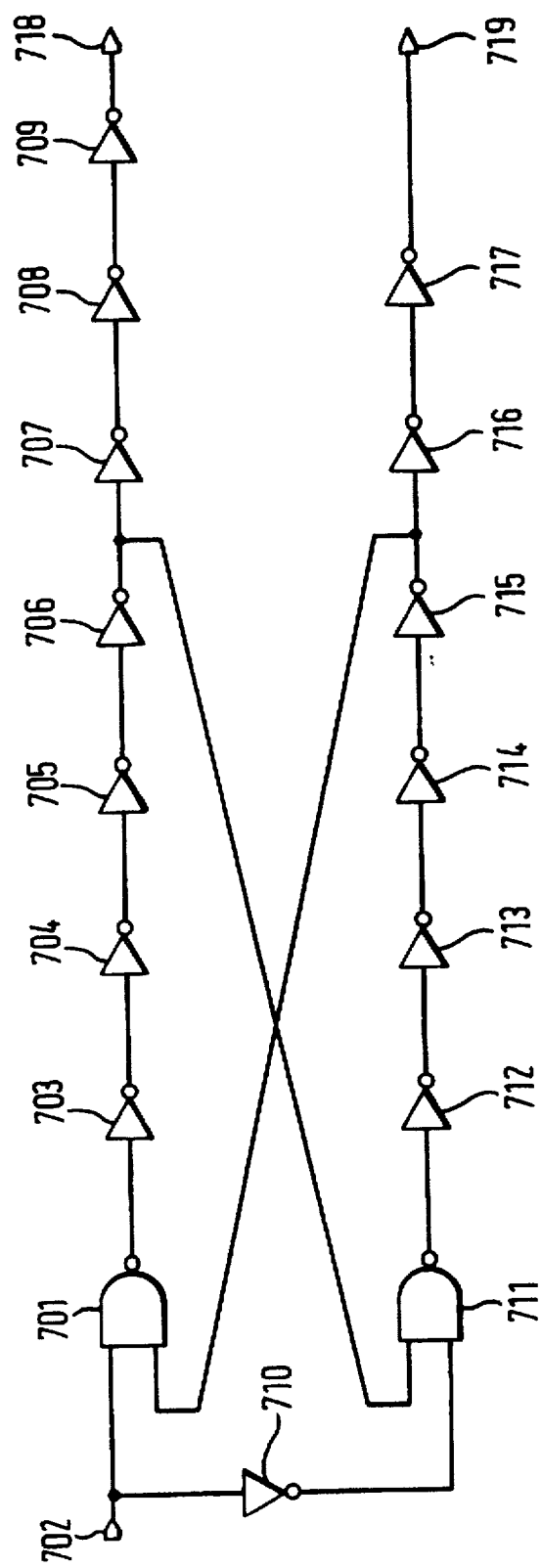
FIG. 7 shows a circuit diagram of an erase switch clock control circuit for use in the circuit of FIG. 4.

The array switch clock control circuit previously described with respect to FIG. 7, produces falling transitions in the first delayed erase clock pulse (-E) and in the second delayed erase clock pulse (E). The falling transition occurs first in the second delayed erase clock pulse (E), which pulse is applied via series inverters 422, 423 to the gate of FET 406 of the third current supply circuitry, so that this FET turns off. After a predetermined delay, the first delayed erase clock pulse (-E) is produced. The time between the falling transitions is selected to be sufficient for the FET 406 to be turned off before the transition in the first delayed erase clock pulse (-E) appears at the input to the first trigger circuitry 420.

The appearance of the falling transition at input 431 causes the first trigger circuitry 420 to switch on FET 401 of the first current supply circuitry.

Current is then supplied from the supply node 143 via the first current supply circuitry FET 401 to the array ground node 300. As previously discussed, the array ground node 300 is common to a potentially large number of flash memory cells, and accordingly has substantial capacitance. As the current flows to the node through the first FET 401, the node voltage rises. The rate of rise of the voltage is determined by the impedance of the relatively small first FET 401.

The voltage on the array ground node 300 is connected to the array ground inputs of the driver devices 4211, 4212, 4213 of the second trigger circuitry 421. Each of the driver devices has a respective second output connected to the gate of a respective one of the FETs 403-405 of the second current supply circuitry 402. Each of the driver devices 4211, 4212, 4213 receives a low voltage at the respective second input terminal thereof (from the first delayed erase pulse signal) and under normal conditions also receives a low-level inhibit signal at the fourth input terminal 522. However, only certain of the driver devices 4211, 4212, 4213 are selected to be enabled by application of a low potential at corresponding pull-up enable inputs 451-453. Accordingly, in the selected driver devices, the respective second NOR gate 532 has an output at a high level, causing the respective eighth transistor 602 to be conductive. As the array ground node voltage increases, the seventh FET 601 of each selected driver device becomes conductive so that corresponding second outputs of the selected driver devices change state. Hence the FETs 403-405 selected by the pull-up enable inputs are biased into conduction.

At the end of the erase period, the voltage on the array ground node 300 is substantially that at the supply node 143, in other words around 12 volts, and the erase pulse applied to the fourth input terminal 443 of the source switch and to the input terminal 702 of the array switch clock control circuit goes high once again. In response to this the first delayed erase pulse (-E) also goes high after a first delay and the second delayed erase pulse (E) goes high after a second, longer delay. The result of the first delayed erase clock pulse going high is to turn on the respective fifth transistors in the first and second trigger circuitry 420 and 421, thereby returning the second output node 505 of each circuit to the high condition. Accordingly, the four parallel n-channel FETs 401-405 turn off. Although the erase pulse is applied via the previously-discussed logic circuit to the fourth n-channel FET 408, the operation of this FET is inhibited by the presence of a high potential on the third input terminal 442 of the source switch, this potential being derived from the array ground feed back control circuit at output terminal 811.

As noted above, the second delayed erase pulse (E), applied to the first input terminal 440 of the source switch occurs somewhat later than the first delayed erase pulse (-E), and after a further delay occasioned by the series connection of the two inverters 422 and 423, this second delayed erase pulse enables FET 406. FET 409 is already maintained in the conductive condition by the bias at the second input terminal 441 of the source switch, this bias also being applied to the first input terminal 512 of the first trigger circuitry 420, and the driver devices 4211, 4212, 4213 of the second trigger circuitry 421. FET 406 pulls down the array ground node 300 towards ground potential. The array ground node potential is monitored by the array ground feed back control circuit and once the array ground potential has fallen to around one volt above ground, the array ground control signal at the output 811 of the array ground feed back control circuit, applied to the third input terminal 442 of the source switch goes low, which then enables the fourth current supply circuitry FET 408 to be made conductive. Once the FET 408 is enabled, as previously discussed, this device applies a large pull-down to the array ground, allowing the array ground to sink substantial currents to the ground terminal 407.

If the second supply voltage VCC is absent, a high inhibit signal is applied to FET 411 as well as to the inhibit signal terminals of the first and second trigger circuitry. As a result the array ground node 300 is maintained in the pulled-down position, in other words at substantially ground potential.

Although the above-described arrangement operates in a voltage-responsive fashion, it is instead envisaged that the relevant FETs could be turned on and off after determined time delays. In this case the operation would be as follows.

At the start of an erase operation, the fourth FET 408 is turned off together with the FET arrangement 406. After a first predetermined period the first FET 401 is turned on. After a second predetermined period other FETs of the second current supply circuitry 402 are turned on, until the array ground node 300 is fully pulled up to the supply terminal 143. At the end of the erase operation, the "on" pulses applied to the FETs 401-5 are terminated, and the FETs accordingly become non conductive. After a third predetermined period the third current supply circuitry FET 406 is made conductive and after a yet further predetermined period the fourth FET 408 is turned on.

The invention has particular advantage in a flash memory having single transistor cells with a floating gate. The operation of one type of such flash memory cell will be described hereinbelow with reference to FIGS. 10-12 of the accompanying drawings.

FIG. 10 illustrates a flash memory cell 2 comprising a single floating gate transistor 4 having a control gate CG, a floating gate FG, a source S, and a drain D. The source S of the floating gate transistor 4 is connected to an ARRAY GROUND signal on line 10. Through a source voltage switch circuit 14 this line 10 can be at a ground voltage VGND or a high voltage Vpp. Voltage Vpp represents a programming potential (typically 12 V) and voltage VGND represents device ground. Vpp is normally connected to array ground via a resistor (not shown). The source voltage switch 14 is connected to the voltage Vpp via line 34 and the voltage VGND via line 36. The control gate CG of the floating gate transistor 4 is connected to a gate voltage switch 12 by a word line (WL) 8. The gate voltage switch 12 is further connected to voltages V'cc, Vpp and VGND on lines 26, 24 and 22 respectively. V'cc is at 5 V where the memory is supplied with the above described second positive supply voltage VCC at 5 volts. Where the second positive supply voltage is at 3 volts, boosting provides V'cc of about 5 volts. Source and gate voltage switches 14 and 12 each receive a control signal ERASE on line 28 and additionally the gate voltage switch 12 receives a control signal PROGRAM on line 30. The drain D of the floating gate transistor 4 is connected to a bit line switch 31 by a bit line (BL) 6. The bit line switch is further connected to the input of a programmable load circuit 32 on line 27 and the input of a sense amplifier circuit 29 on line 25. The output of the sense amplifier circuit 29 on line 23 forms a data line (DL). The switch 31 receives a control signal SELECT on line 21. The programmable load circuit 32 receives load control signals on lines 38.

The flash memory has three modes of operation: program, erase and read. Each of these modes will be described hereinafter with reference to FIG. 10. The program mode involves writing a "0" to a memory cell or group of memory cells, the erase mode involves removing a "0" from any cell that has a "0" stored in it such that the cells all effectively store "1"s, and the read mode involves reading a cell to establish whether it is programmed or erased, i.e. contains either a "0" or a "1".

During a program mode, the control signal PROGRAM on line 30 is set such that the gate voltage switch 12 is configured to connect the voltage Vpp on line 24 to the control gate CG of transistor 4 via word line 8. As the control signal ERASE on line 28 is not set the source voltage switch 14 is configured to connect the voltage VGND on line 36 to the source of transistor 4 via the ARRAY GROUND signal line 10. The control signal SELECT on line 21 is set such that the bit line on line 6 is connected to the programmable load 32 by line 27. The load control signals 38 are set such that the programmable load 32 is controlled such that a voltage of about 5 V is on the drain D of the transistor 4 via the bit line 6. As a result of these signals applied to the transistor 4, electrons flow in the channel region and move to the floating gate so that the floating gate FG becomes negatively charged. The negative charge shifts the threshold voltage of the floating gate transistor making it less conductive. The amount of negative charge accumulated at the floating gate depends on the duration for which the control signal PROGRAM is set. In this way, a "0" is written into the cell. Normally, several program pulses are needed, each pulse being followed by a verify cycle.

During an erase mode, the control signal ERASE on line 28 is set such that the gate voltage switch 12 is configured to connect the voltage VGND on line 22 to the control gate CG of the transistor 4 via the word line 8, and such that the switch 14 is configured to connect the voltage Vpp on line 34 to the source S of the transistor 4 via the ARRAY GROUND line 10. The control signal SELECT on line 21 is again set such that the bit line 6 is disconnected so that it floats. As the floating gate transistor is fabricated such that the source region in the substrate underlies the floating gate, any negative charge on the floating gate FG will be reduced. The amount of negative charge removed from the floating gate depends on the duration for which the ERASE signal on line 28 is set. The reduction of negative charge shifts the threshold voltage of the floating gate transistor making it more conductive. In this way the state of the cell is restored to "1". Normally, several erase pulses are required, each erase pulse being followed by a verify cycle.

During a read mode, neither the control signal ERASE on line 28 nor the control signal PROGRAM on line 30 are set. Consequently, the V'cc signal on line 26 is connected by the gate voltage switch 12 to the control gate of the transistor 4 via the word line 8 and the voltage VGND on line 36 is connected to the source of the transistor 4 via the ARRAY GROUND signal line 10. The bit line 6 is precharged to approximately b 1volt prior to a read operation by a bit line load (not shown) within the sense amplifer circuit. During a read operation, for an erased cell (with "1" stored in it) a current will be drawn by the cell when the bit line is connected for sensing. For a programmed cell (with a "0" stored in it) no current is drawn by the cell. The current drawn by the cell is compared with a reference current to detect the logic state of the cell.

The operation of a flash cell in a memory array will now be described with reference to FIG. 11. Signal lines or circuitry common to FIG. 10 can be identified in FIG. 10 by use of the same reference numerals. Voltage supplies have not been illustrated in FIG. 11 for reasons of clarity, but it will be understood with reference to FIG. 10 which voltages are required in various pans of the circuit.

FIG. 11 illustrates a flash memory array 50 comprising a plurality of flash memory cells FMoo ... FMnm, arranged in rows and columns, each of which can be the same as the cell 2 shown in FIG. 9. The gates of the transistors in each memory cell in a row are commonly connected to a respective word line WLo ... WLn addressable by a row line decode circuit 56 which receives the row address 64. The gate voltage switch 12 responds to the control signals PROGRAM and ERASE on line 30 and 28 respectively, and supplies the appropriate gate voltage Vccx on line 20 to be switched to the addressed wordline through the new decode circuit 56.

The drains of each transistor in a column are commonly connected by bit lines BLo ... BLm to a column line decode circuit 58. The column line decode circuit can be considered as a plurality m of the bit line switch circuits 31, with the SELECT signal being generated responsive to the column address 48. The output of the column line decode circuit 58 on line 25 is a read output and is connected to the sense amplifier circuit 29. The sense amplifier 29 contains sense amplifiers and bit line load circuits. The column line decode circuit receives a write input on line 27 from the programmable load circuit 32. The programmable load circuit is controlled by the load control signals 38. During a program operation the bit lines BLo to BLm are selectively connected to the programmable load circuit 32. During a read operation the selected bit line (or bit lines) is connected to a sense amplifier in the sense amplifier circuit 29, all the other bit lines being connected to ground. The sense amplifier circuit 29 also receives a reference signal REF on line 72 and generates an output signal on the data line (DL) on line 23.

It will be appreciated that when a particular cell is chosen to be programmed, the programming load will only be applied to a selected column so that other cells in the same row as the selected cell are not inadvertently programmed. In addition in general during read and program operations it is desirable to apply certain signals to cells in the array which have not been selected to improve the performance of the cell, as is well known in the art. During an erase operation every cell in the memory array is erased, although it will be appreciated by a person skilled in the art that an array could be split into sectors for erasing so that only part of the array is erased at any one time. The table of FIG. 12 shows the voltages which need to be applied to the selected and unselected cells for each of a program, erase and read operation.

I claim:

1. A memory array having a plurality of charge storing transistors each connected to a control line; the memory array comprising:

a first pull-up circuit for supplying a first pull-up current for the control line;

a second pull-up circuit for supplying a second pull-up current for the control line;

a third pull-down circuit for supplying a third pull-down current for the control line;

a fourth pull-down circuit for supplying a fourth pull-down current for the control line;

means of changing the voltage level of the control line between a lower voltage level and an upper voltage level while preventing high transient currents by disabling said third pull down circuit and said fourth pull-down circuit and, after said third and fourth pull-down circuits are disabled, enabling said first pull-up circuit thereby providing said first pull-up current while inhibiting said second pull-up circuit until the control line has reached a desired first voltage level after which said second pull-up circuit is enabled thereby providing said second pull-up current; and means of changing the voltage level of the control line between an upper voltage level and a lower voltage level while preventing high transient currents by disabling said first pull-up circuit and said second pull-up circuit and, after said first and second pull-up circuits are disabled, enabling said third pull-down circuit thereby providing said third pull-down current, while inhibiting said fourth pull-up circuit until the control line has reached a desired second voltage level after which said fourth pull-up circuit is enabled thereby providing said fourth pull-down current.

2. The memory array of claim 1 wherein said second pull-up circuit comprises a plurality of p-channel FETs connected in parallel; said memory array comprising means to control the impedance of said second pull-up circuit by selectively enabling a desired number of said plurality of p-channel FETs.

3. A method of changing the voltage from a lower voltage level to an upper voltage level on a control line in a memory array having a plurality of charge storing transistors connected to the control line and supplied therefrom with a common control voltage, the method comprising the steps of:
 disconnecting the control line from a pull-down circuit;
 connecting the control line to the upper voltage level via a first pull-up circuit after said pull-down circuit is disconnected;
 delaying a desired period of time; and
 connecting the control line to the upper voltage level via a second pull-up circuit.

4. The method of claim 3 wherein the desired period of time is completed when the voltage level of the control line exceeds a threshhold voltage.

5. A method of changing the voltage from an upper voltage level to a lower voltage level on a control line in a memory array having a plurality of charge storing transistors connected to the control line and supplied therefrom with a common control voltage, the method comprising the steps of:
 disconnecting the control line from a pull-up circuit;
 connecting the control line to the lower voltage level via a third pull-down circuit, after said pull-up circuit is disconnected;
 delaying a desired period of time; and
 connecting the control line to the lower voltage level via a fourth pull-down circuit.

6. The method of claim 5 wherein the second desired period of time is completed when the voltage level of the control line is less than a threshhold voltage.

7. A memory array comprising:
 a plurality of charge storing transistors;
 a control line connected to said plurality of charge storing transistors to supply a common control voltage thereto; and
 a pull up/pull down voltage control circuit for changing said control voltage on the control line between an upper voltage level and a lower voltage level, said voltage control circuit having a first switch circuit to connect said control line to the upper voltage level and a second switch circuit to connect said control line to the lower voltage level, wherein each of said switch circuits has a plurality of parallel switch devices together with a switch control to vary sequentially the impedance of the switch circuit during a switch operation to pull the control line to the voltage of the respective voltage level and further comprising delay circuitry for delaying connection of said control line to each respective voltage level until said control line has been disconnected from the respective other voltage level whereby high transient currents are prevented.

8. The memory array of claim 7 wherein the switch control is arranged to switch on sequentially a changing number of said switch devices.

9. The memory array of claim 7, further comprising:
 circuitry responsive to a supply potential; and
 inhibit circuitry responsive to an inhibit signal for inhibiting one of said first switch circuit and said second switch circuit when the supply potential is below a minimum level.

10. The memory array of claim 7 wherein the charge storing transistors are flash memory transistors.

11. A method of supplying voltage to a control line in a memory array having a plurality of charge storing transistors connected to said control line and supplied therefrom with a common control voltage, the method comprising the steps of:
 connecting said control line to an upper voltage level via a first switch circuit, whereby the voltage on said control line is pulled up towards said upper voltage level;
 disconnecting said control line from said upper voltage level;
 then connecting said control line to a lower voltage level via a second switch circuit, whereby the voltage on said control line is pulled down towards said lower voltage level; and
 disconnecting said control line from said lower voltage level wherein each of said connecting steps comprises controlling a plurality of parallel switch devices to vary sequentially the impedance of the respective switch circuit during a switch operation, whereby high transient current flow is prevented.

12. A memory array comprising:
 a plurality of cells connected to a control line; and
 a circuit for controlled pull-up and controlled pull-down of the control line comprising pull-up circuitry, pull-down circuitry and control circuitry, said pull-up circuitry having first current supply circuitry for supplying a first pull-up current to the control line and second current supply circuitry for supplying a second pull-up current to the control line, said pull-down circuitry having third current supply circuitry for supplying a third pull-down current to the control line, and fourth current supply circuitry for supplying a fourth pull-down current to the control line; and, said control circuitry being adapted to select between said first and second, and said third and fourth currents during a pull up/pull down operation to vary the impedance of the pull up/pull down current path wherein said control circuitry comprises delay circuitry for delaying the application of pull-up current until the supply of pull-down current has ceased, and for delaying the application of pull-down current until the supply of pull-up current has ceased, whereby high transient currents are prevented.

13. The memory array of claim 12 wherein the control circuitry comprises:
 first trigger circuitry for triggering operation of the first current supply circuitry in response to a pull-up control signal;
 third trigger circuitry responsive to a pull-down control signal for triggering operation of the third current supply circuitry;
 second trigger circuitry for triggering operation of the second current supply circuitry in response to a first voltage level of said control line; and fourth trigger circuitry for triggering operation of the fourth current supply circuitry in response to a second voltage level of said control line.

14. The memory array of claim 13, further comprising: circuitry responsive to a supply potential; and
inhibit circuitry responsive to an inhibit signal for inhibiting said pull-up circuitry when the supply potential is below a minimum level.

15. The memory array of claim 12 wherein said first trigger circuitry has a logic circuit supply node for powering logic circuitry thereof, said logic circuit supply node receiving one of a first voltage at a first higher nominal level and a second voltage at a second lower nominal level, and said first trigger circuitry comprising compensation circuitry for equalising the response of the first trigger circuitry when said logic circuitry is supplied at said second lower level to the response when supplied at the first higher level.

16. A memory array comprising:
a plurality of cells connected to a control line;
a circuit for controlled pull-up and controlled pull-down of the control line, comprising pull-up circuitry having first current supply circuitry for supplying a first pull-up current to the control line and second current supply circuitry for supplying a second pull-up current to the control line, pull-down circuitry having third current supply circuitry for supplying a third pull-down current to the control line, and fourth current supply circuitry for supplying a fourth pull-down current to the control line; and, control circuitry for selecting between said first and second, and said third and fourth currents during a pull-up/pull-down operation to vary the impedance of the pull-up/pull-down current path wherein said control circuitry comprises first trigger circuitry for triggering operation of the first current supply circuitry in response to a pull-up control signal and third trigger circuitry responsive to a pull-down control signal for triggering operation of the third current supply circuitry and voltage responsive circuitry comprising second trigger circuitry for triggering operation of the second current supply circuitry in response to a first voltage level of said control line and fourth trigger circuitry for triggering operation of the fourth current supply circuitry in response to a second voltage level of said control line.

17. The memory array of claim 16 wherein the second trigger circuitry comprises a cross-coupled pair of switching devices, each having a respective main current path, a first switching device in series with one of said main current paths and a second switching device in series with the first switching device, whereby said one of said main current paths is connected between a first and a second supply node, said first switching device being responsive to said pull-up control signal, and said second switching device being responsive to the voltage on said control line whereby a change of state of said cross-coupled devices is enabled by said second voltage level.

18. The memory array of claim 16 wherein in said second trigger circuitry, said pair of switching devices is a cross-coupled second pair of FETs forming a bistable arrangement, said second trigger circuitry further comprising a third current path in series with the channel of a first FET of said second pair and a fourth current path in series with the channel of the second FET of said second pair, said third current path having a node connected to said second current supply circuitry, said third current path being enabled in response to said first voltage level of said control line, whereby the second current supply circuitry is triggered, and the fourth current path being enabled in response to the absence of said pull-up control signal whereby the second current supply circuitry is inhibited.

19. The memory array of claim 16 wherein said first trigger circuitry has a logic circuit supply node for powering logic circuitry thereof, said logic circuit supply node receiving one of a first voltage at a first higher nominal level and a second voltage at a second lower nominal level, and said first trigger circuitry comprising compensation circuitry for equalising the response of the first trigger circuitry when said logic circuitry is supplied at said second lower level to the response when supplied at the first higher level.

20. A memory array having a plurality of cells connected to a control line and a circuit for controlled pull-up and controlled pull-down of the control line, comprising pull-up circuitry having first current supply circuitry for supplying a first pull-up current to the control line and second current supply circuitry for supplying a second pull-up current to the control line, pull-down circuitry having third current supply circuitry for supplying a third pull-down current to the control line, fourth current supply circuitry for supplying a fourth pull-down current to the control line and control circuitry for selecting between said first and second pull-up currents, and said third and fourth pull-down currents during a pull up/pull down operation to vary the impedance of the pull up/pull down current path wherein said control circuitry comprises first trigger circuitry for triggering operation of the first current supply circuitry in response to a first pull-up control signal, said first trigger circuitry comprising logic circuitry operable by a power supply voltage at one of a first higher and second lower nominal level, and further comprising compensation circuitry for equalising the response of the first trigger circuitry when supplied by the second level to that when supplied at the first level.

21. The memory array of claim 20 wherein the first trigger circuitry comprises a cross-coupled pair of switching devices, each having a respective main current path, a first switching device in series with one of said main current paths, whereby one of said main current paths is connected between a first and a second supply node, and said compensation circuitry comprises a second switching device in parallel with said first switching device.

22. The memory array of claim 21 wherein said cross-coupled pair of switching devices of the first trigger circuitry is a cross-coupled first pair of FETs forming a bistable arrangement, the first trigger circuitry further comprising a first current path in series with the channel of a first FET of said first pair and a second current path in series with the channel of the second FET of said first pair, said first current path having a node connected to said first current supply circuitry said first current path being enabled in response to the pull-up control signal whereby the first current supply circuitry is triggered, and said second current path being enabled in response to the absence of said pull-up control signal whereby the first current supply circuitry is inhibited.

23. The memory array of claim 20 wherein said second trigger circuitry comprises a cross-coupled second pair of FETs forming a bistable arrangement, a third current path in series with the channel of a first FET of said second pair and a fourth current path in series with the channel of the second FET of said second pair, said third current path having a node connected to said second current supply circuitry, said third current path being enabled in response to said first voltage level of said control line, whereby the second current supply circuitry is triggered, and the fourth current path being enabled in response to the absence of said pull-up control signal whereby the second current supply circuitry is inhibited.

24. The memory array of claim 20 wherein first current supply circuitry has a p-channel FET having a first width-length ratio, and the second current supply circuitry comprises a second p-channel FET having a second width-length ratio, whereby said impedance may be varied.

25. The memory array of claim 24 wherein the second current supply circuitry comprises a plurality of p-channel FETs with their drain source paths connected in parallel, the third current supply circuitry comprising an n-channel FET having a third width-length ratio, and the fourth current supply circuitry comprises an n-channel FET having a fourth width-length ratio.

26. The memory array of claim 25, further comprising: circuitry for enabling a desired number of said plurality of p-channel FETs whereby the impedance of said second current supply circuitry may be selected.

27. The memory array of claim 26 wherein said enabling circuitry receives a plurality of input signals for determining which of said plurality of p-channel FETs is enabled, and further comprising control circuitry for providing said plurality of input signals, whereby said plurality of input signals may be varied to control said second pull-up current.

28. The memory array of any of claim 12 wherein the memory array is a flash memory array, and wherein the control line comprises an array ground of said flash memory array.

* * * * *